United States Patent [19]
Citta

[11] Patent Number: 4,951,146
[45] Date of Patent: Aug. 21, 1990

[54] DIRECTIONALLY CONTROLLED DISPERSIVE FILTERING FOR REDUCING CO-CHANNEL INTERFERENCE

[75] Inventor: Richard W. Citta, Oak Park, Ill.
[73] Assignee: Zenith Electronics Corporation, Glenview, Ill.
[21] Appl. No.: 298,081
[22] Filed: Jan. 17, 1989
[51] Int. Cl.⁵ .............................. H04N 5/40
[52] U.S. Cl. ............................. 358/186; 358/195.1
[58] Field of Search .................... 358/186, 188, 195.1, 358/166, 167

[56] References Cited

U.S. PATENT DOCUMENTS

| | | | |
|---|---|---|---|
| 3,596,211 | 7/1971 | Dias | 358/188 |
| 3,737,785 | 6/1973 | Korpel | 358/188 |
| 4,060,833 | 11/1977 | Onyshkevych | 358/188 |
| 4,126,838 | 11/1978 | McCusker | 358/188 |
| 4,253,119 | 2/1981 | Jones | 358/188 |
| 4,564,858 | 1/1986 | Resch | 358/186 |

*Primary Examiner*—Tommy P. Chin

[57] ABSTRACT

A reduced co-channel interference television transmission system includes a transmitter that transmits a video signal dispersed in one sense and a receiver having a selectively reversible dispersal filter for recovering the transmitted signal. The transmitted signal includes data concerning the sense or direction of the transmitter dispersal filter. The data is received by the receiver and used to automatically select the correct sense of the receiver dispersal filter. A SAW implementation of a reversible dispersal filter is shown.

6 Claims, 3 Drawing Sheets

FIG. 7
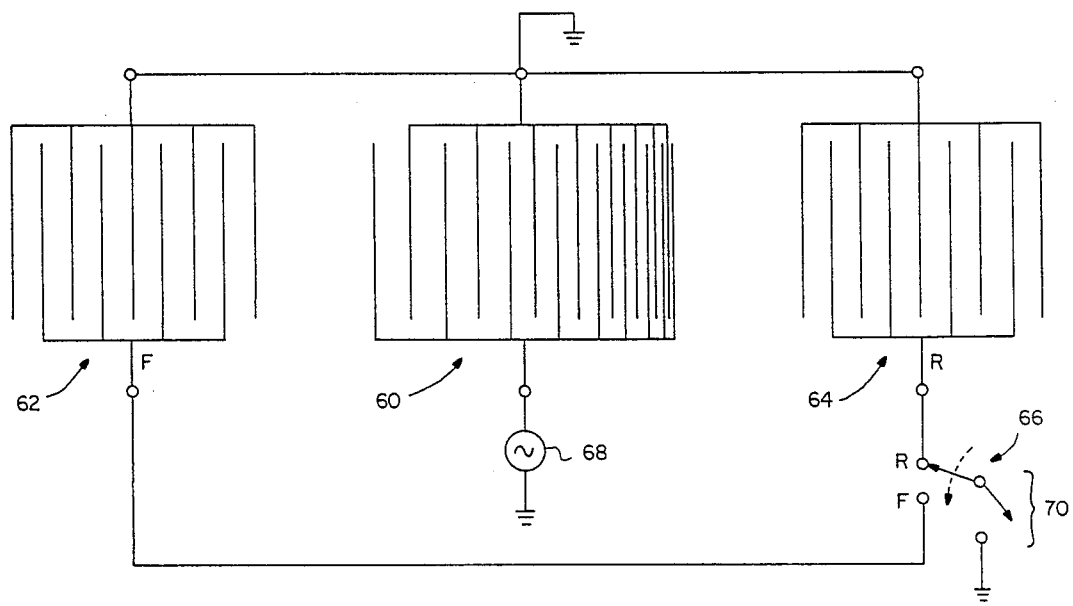
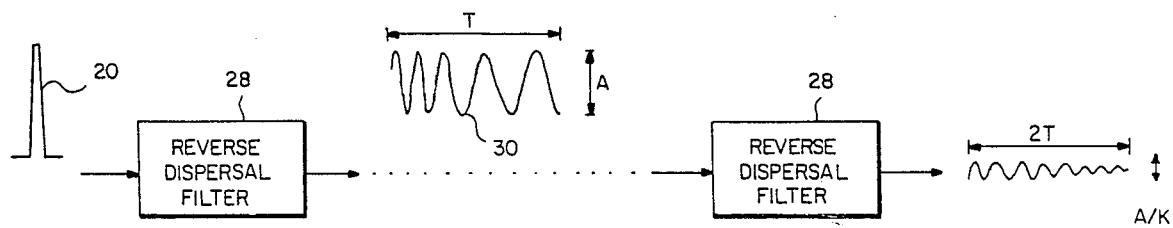
FIG. 5A
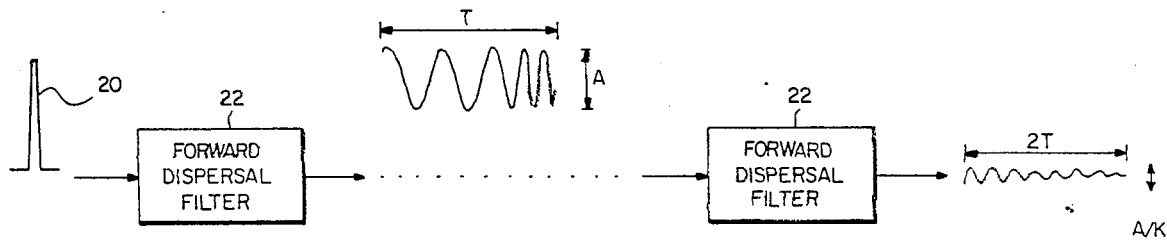
FIG. 5B

DIRECTIONALLY CONTROLLED DISPERSIVE FILTERING FOR REDUCING CO-CHANNEL INTERFERENCE

CROSS REFERENCE TO RELATED APPLICATIONS

This invention is related to, but in no way dependent upon the inventions in: application Ser. No. 238,956, filed Aug. 31, 1988, entitled TV SIGNAL TRANSMISSION SYSTEMS AND METHODS in the name of R. Citta; application Ser. No. 239,155, filed Aug. 31, 1988, entitled HIGH DEFINITION TELEVISION SYSTEM in the names of R. Citta and R. Lee; and application Ser. No. 266,740, filed Nov. 11, 1988, entitled CLOCK SIGNAL COMMUNICATION SYSTEM in the name of R. Citta, all of which are assigned to Zenith Electronics Corporation.

BACKGROUND OF THE INVENTION AND PRIOR ART

This invention relates generally to television signal transmission methods systems and specifically to a novel television signal transmission method and system which have improved co-channel performance characteristics.

A longstanding problem of television signal reception is that of minimizing interference from other transmitted signals. This has necessitated the controlled allocation of carrier signal frequencies and power ratings for transmitters as well as the locations of transmitting antennas. Interference problems can be readily classified as those due to adjacent channel signals, that is, television signals that are near the frequency of the signal being received and co-channel signal problems, that is, signals that are at the same frequency as the signal being received. In the first two of the above mentioned co-pending applications, various techniques are discussed for minimizing interference at a receiver from different television signals in both co-channel and adjacent channel situations. In particular, the role of dispersal filtering to reduce peak signal amplitudes and thereby reduce the interfering effects of such signals is described. The third mentioned application is concerned with the use of dispersal filtering for transmitting and accurately recovering a clock signal.

The present invention is directed to a method and system for significantly reducing co-channel interference by the use of directionally controllable dispersal filters in the transmitter and the receiver.

OBJECTS OF THE INVENTION

A principal object of the invention is to provide a novel television transmission system and method.

Another object of the invention is to provide a television signal transmission system and method having decreased sensitivity to co-channel interference.

BRIEF DESCRIPTION OF THE DRAWINGS

These and other objects of the invention will be apparent upon reading the following description in conjunction with the drawings in which:

FIG. 5 illustrates the action of dispersed filters of the same operating sense in minimizing co-channel interference;

FIG. 7 illustrates a SAW implementation of a directional dispersal filter.

DESCRIPTION OF THE PREFERRED EMBODIMENT

Figure 1:
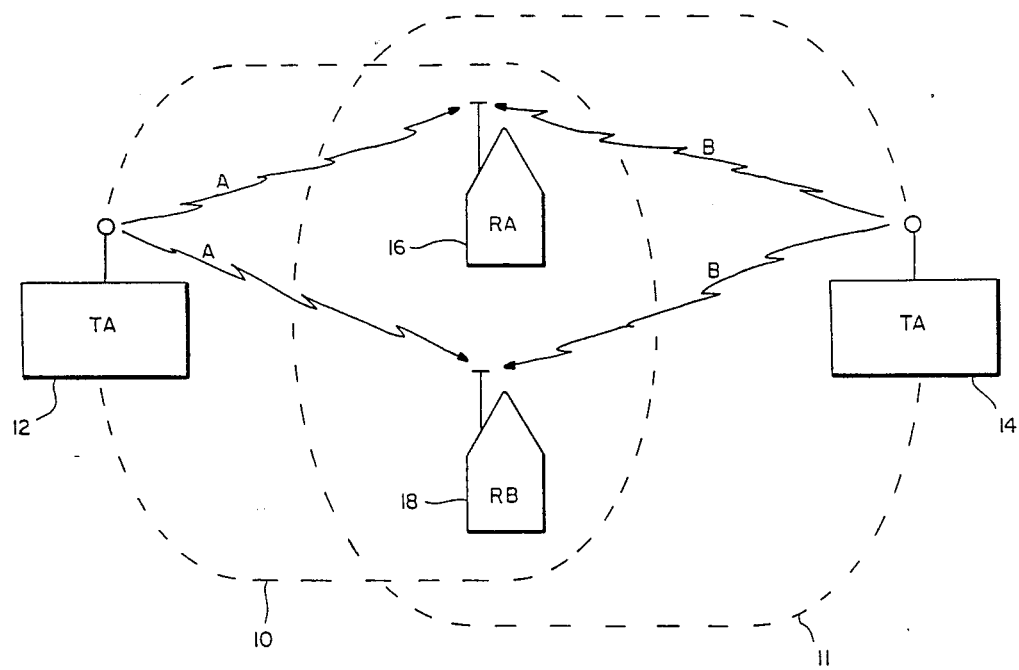
FIG. 1 is a highly simplified diagram illustrating the co-channel interference problem with two transmitters and two receivers.

Referring to FIG. 1, a first transmission system A covers a signal area 10 that includes a transmitter 12 and a receiver 16. A second transmission system B covers a signal area 11 and includes a transmitter 14 and a receiver 18. Transmitter 12 emits an A signal and transmitter 14 emits a B signal. As illustrated, due to the overlap between service areas 10 and 11, the A signal from transmitter 12 is receivable by both receiver 16 and receiver 18, and the B signal from transmitter 14 is similarly receivable by both receivers 16 and 18. If the transmitters 12 and 14 are transmitting on the same carrier frequencies, the receivers 16 and 18 will experience co-channel interference. The degree of interference is a function of the relative field strengths of the transmitted signals and the quality of the individual receiving systems. For FIG. 1, the field strengths are assumed to be approximately equal, which is a situation that would not prevail under present NTSC signal allocations.

Figure 2A:
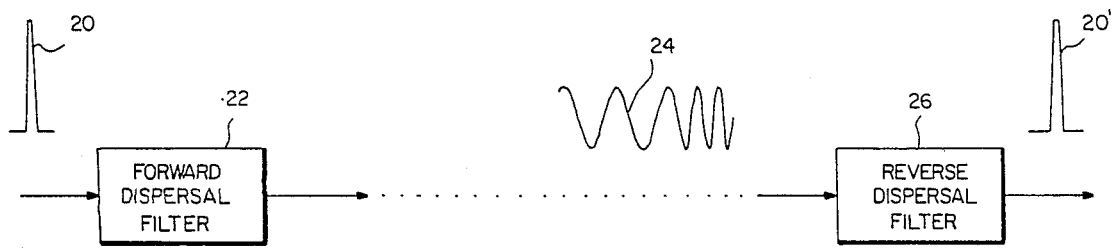
FIG. 2 illustrates the action of dispersal filters in reducing the amplitudes of impulse signals.
Figure 2B:
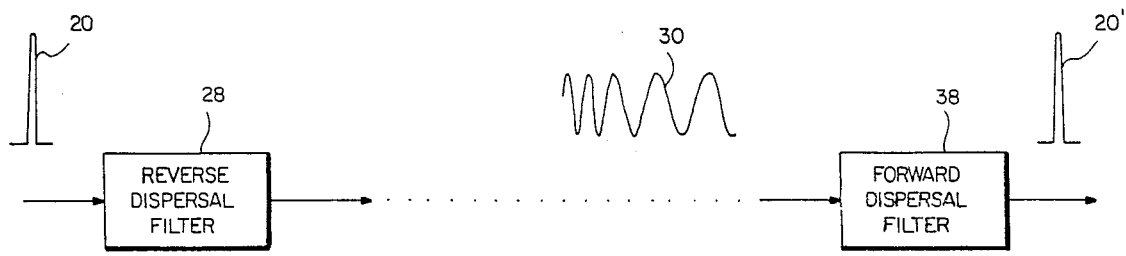

In FIG. 2, the upper diagram illustrates a signal impulse 20 that is applied to a forward dispersal filter 22, i.e. a filter operating in the forward sense. The output is shown as an idealized waveform 24 which has a much lower amplitude (approximately 24 percent of the amplitude of signal impulse 20) and an increasing frequency over its duration. Waveform 24 is applied to a reverse dispersal filter 26 which is identical in all respects to forward dispersal filter 22 except that it is operated in the reverse sense or direction. The output signal impulse 20' is substantially the same as the input signal impulse 20. In the lower diagram, input signal impulse 20 is applied to a reverse dispersal filter 28 which produces a waveform 30 of opposite configuration, i.e. it is a reverse image of waveform 24. Waveform 30, when applied to an identical dispersal filter 32 operating in the opposite (reverse sense) direction, also produces an output signal impulse 20'. In practice, the amplitudes of the dispersed waveforms are not uniform, but are lower at the beginning and at the end of the waveform.

Figure 3:
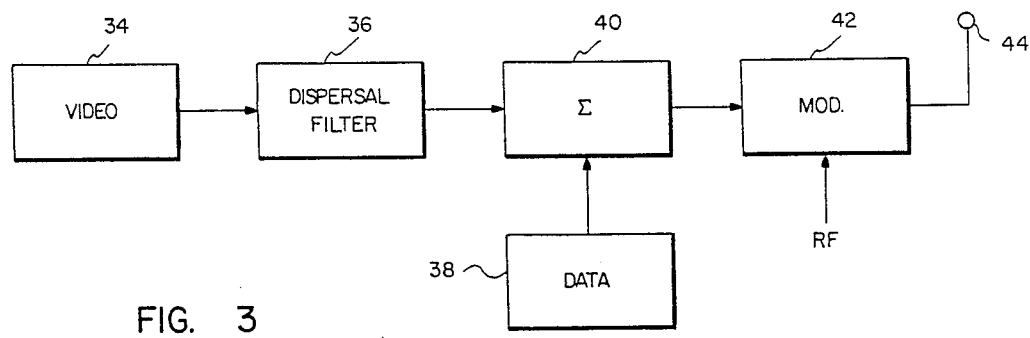
FIG. 3 is a simplified block diagram of a transmitter operating in accordance with the invention.

In FIG. 3, a highly simplified transmitter is shown in block diagram form. A source of video signal 34 supplies a video signal to a dispersal filter 36 which operates in one sense or direction. The dispersed or processed video signal is supplied to a summation circuit 40 which is also supplied with data from a data source 38 that indicates the operating sense of dispersal filter 36. The output of summation circuit 40 is supplied to a modulator 42, to which is supplied an RF carrier signal. The dispersed video signal modulates the RF carrier and is transmitted via an antenna 44. As mentioned, dispersal filter 36 operates in one sense or direction. It may thus have a characteristic similar to that of dispersal filter 22 or of dispersal filter 28 shown in FIG.

2. The net effect of serially processing a signal through dispersal filters of one sense and of the opposite sense is to recover the original signal.

Figure 4:
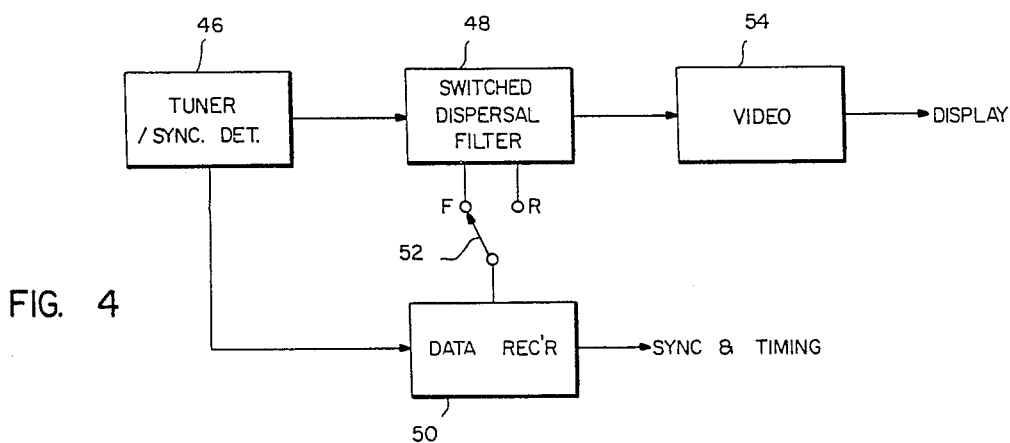
FIG. 4 is a simplified block diagram of a receiver operating in accordance with the invention.

In FIG. 4 the receiver includes a tuner/synchronous detector 46 that receives signals transmitted from the transmitter in FIG. 3. The synchronous detector is a preferred detection means and should not be considered limiting of the invention. The output of the synchronous detector is supplied to a switched dispersal filter 48 that in turn supplies a video processing circuit 54 that includes well known apparatus for amplifying the video signal to a level sufficient for driving a display (not shown), such as a conventional cathode ray tube. The data in the received signal is recovered in a data receiver 50 which also develops the sync and timing signals for the remainder of the receiver circuitry (not shown) and operates a switching arrangement for controlling the operating sense or direction of the dispersal filter 48. This is illustrated schematically by a switch 52 that is switchable between two terminals labelled F (forward) and R (reverse), respectively.

FIG. 5 illustrates the co-channel reducing effect of the dispersal filter method of transmission of the present invention. With an impulse signal 20 and a reverse sense dispersal filter 28, the waveform 30 having an amplitude A and a duration T results. In being processed through an identical dispersal filter 28, the waveform 30 is reduced to an amplitude A/K and a duration of 2T. Under ideal conditions, the output amplitude is negligible and may readily be eliminated in the receiver. The same is true for a forward dispersal filter 22 in the transmitter and in the receiver. Therefore, by coordinating the sense of the dispersal filter in the receiver, signals from two different co-channel transmitters may be separately receivable by each transmitter's associated receivers without co-channel interference problems.

In operation, the dispersed video signal transmitted by the transmitter of FIG. 3 will have been dispersed in either a forward or a reverse direction. The received signal must therefore be oppositely dispersed to properly recover the original video signal. Thus, if the transmitted signal is subject to forward dispersal processing, switch 52 must be positioned in the R position to select reverse dispersal filter processing for the receiver, i.e. filter 48 will be operated in the reverse direction. Assume that a second transmitted signal from another transmitter operating at the sam carrier frequency is received by tuner 46. Further assume that this second signal is reverse dispersed through a filter that is in nearly all respects identical to the filter in the transmitter of FIG. 3. The processing by switched dispersal filter 48 which is operating in the reverse direction (to receive signals from the transmitter of FIG. 3) will further deemphasize or disperse the co-channel signal from the other transmitter and significantly reduce its interfering effect (see FIG. 5 and accompanying description). The same effect will obtain for forward dispersed transmitted signal which is processed by a receiver configured with a forward dispersal filter. It can thus be seen how a receiver can receive signals from two transmitters operating in (close) service areas at the same carrier frequencies, with the desired signal being properly recovered and the effects of the undesired signal being minimized.

Figure 6:
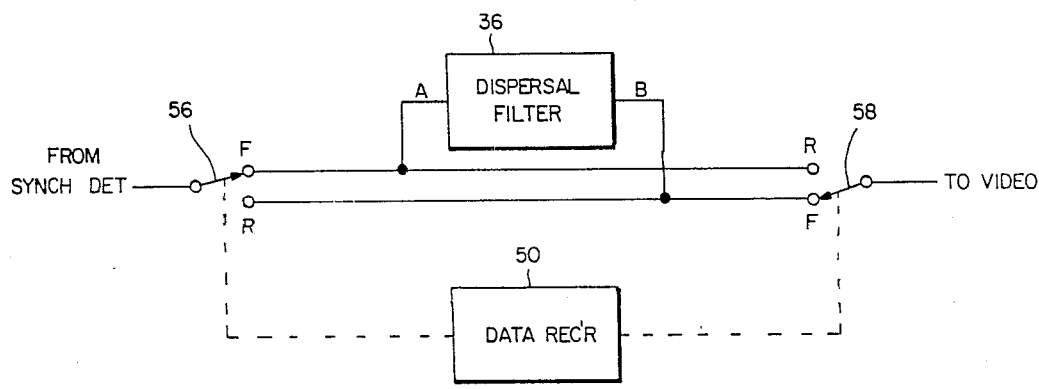
FIG. 6 shows a dispersal filter switching arrangement useful in the receiver of FIG. 4.

In FIG. 6, a relatively simple arrangement for operating switched dispersal filter 48 of FIG. 4 is illustrated. A conventional dispersal filter 36 has two terminals A and B which may function as input and output terminals or as output and input terminals, respectively. Terminal A is coupled to a pair of fixed contacts, labelled F and R, respectively of a ganged two pole switch having a first pole 56 and a second pole 58. Pole 56 is supplied from the synchronous detector 46 and pole 58 supplies the video circuit 54. Terminal B of dispersal filter 36 is coupled to another set of the switch contacts, labelled R and F. Data receiver 50 operates the switch poles 56 and 58 in unison such that in one position they make electrical contact with the F contacts switch and in the other position they make contact with the R contacts. As illustrated, when engaging the F contacts, terminal A is the input of filter 36 and terminal B is the output. When data receiver 50 operates the switch poles to engage the R contacts, terminal B of dispersal filter 56 is the input and terminal A is the output. Thus the sense of dispersal filter 36 is reversed by a simple switching operation under control of a signal received via data receiver 50.

It is well known that transmitted television signals often include information in the form of data in the vertical interval of the signal. Conveying information regarding the sense of the dispersal filter in the transmitter is thus well within the ordinary skill of the art. Such information may be readily detected by suitable well known circuitry to operate the switched dispersal filter in the receiver for recovering the received dispersed video signal. Thus if the transmitter dispersal filter is operated in the forward direction, the receiver dispersal filter is operated in the reverse direction and vice versa. Simultaneously, a transmitter that is operating in the same vicinity on the same channel can avoid co-channel interference by processing its video with a dispersal filter operating in the opposite direction from its co-channel neighbor. Its signal would be coded such that its intended receivers would operate their respective switched dispersal filters to correctly process signals received from that transmitter. In that manner, interference effect of one signal on a receiver receiving a signal of the same frequency from another transmitter is greatly minimized. The result is that transmitters may be located much closer to each other than is presently possible and/or transmitters that presently must operate at spaced apart channel frequencies because of co-channel problems will be able to operate at the same channel frequencies. As those skilled in the art are well aware, the advent of high definition television broadcasting is certain to impose serious burdens on television spectrum utilization and the present invention, with its significantly reduced co-channel interference characteristics, should prove of exceptional value.

Dispersal filters useful with the invention may be constructed in a variety of ways. Digital type filters are known. Another, relatively simple and economically attractive construction uses SAW technology which has long been used in television circuitry. As shown in FIG. 7, a comb 60 is arranged with its fingers spaced in a manner so as to produce a dispersed characteristic to either impinging waves or to waves that are launched on the substrate (not shown) upon which the comb is formed. A signal source 68 is coupled across comb 60, which signal source may represent the input dispersed video signal in a receiver. Comb 60 is flanked on each side by identical uniform transducers, or combs, 62 and 64 for receiving acoustic surface wave signals launched by comb 60. Comb 62 is connected to a switch terminal labelled F and comb 64 is connected to a switch terminal labelled R. A single pole switch 66, movable between terminals F and R, has its output labelled 70. With source 68 being the input from a detector, switch 66 would select whether the dispersal filter was to operate in the direct or reverse mode. For example, due to the spacing of its fingers, launched waves from comb 60 would be received by comb 62 with one sense while the same launched wave from comb 60 will be received by comb 64 in the opposite sense. Therefore, placing switch pole 66 in contact with the F or the R terminal determines the sense of the output signal at output 70. A similar arrangement would be applicable to the use of a switched filter in a transmitter.

What has been described is a novel television signal transmission system and method having improved cochannel characteristics. It is recognized that numerous changes in the described embodiment of the invention will be apparent to those skilled in the art without departing from its true spirit and scope. The invention is to be limited only as defined in the claims.

What is claimed is:

1. A method of operating a television signal transmission system comprising the steps of:
    transmitting a first signal processed through a dispersal filter of one sense;
    transmitting a second signal processed through a dispersal filter of opposite sense;
    receiving said transmitted signals; and
    selectively processing said received signals through a receiver dispersal filter of said opposite sense for recovering said first signal and through a dispersal filter of said one sense for recovering said second signal.

2. The method of claim 1 further including the step of controlling the sense of said receiver dispersal filter by data, carried by each of the transmitted signals.

3. The method of claim 1 wherein said receiver dispersal filter comprises a surface acoustic wave device having a central comb flanked by a pair of symmetrically switchable combs.

4. A television signal transmission system comprising:
    a source of video signal;
    a first dispersal filter having a first operating sense;
    means for processing said video signal with said first dispersal filter to develop a dispersed video signal;
    means for transmitting said dispersed video signal to a receiver;
    means for receiving and detecting said dispersed video signal;
    a second dispersal filter having first and second operating senses, said second operating sense being opposite to said first operating sense;
    switching means for selecting between said operating senses of said second dispersal filter;
    means for identifying the operating sense of said first dispersal filter in said dispersed video signal and for operating said switching means; and
    means for processing said detected, dispersed video signal with said second dispersal filter to recover said video signal.

5. The system of claim 4 wherein said second dispersal filter comprises a SAW device with a pair of switchable combs symmetrically disposed on each side of a central comb.

6. A television signal transmission system comprising:
    at a transmitter:
    a source of video signal;
    a first dispersal filter of a given operating sense;
    means for processing said video signal with said first dispersal filter to develop a dispersed video signal;
    means for transmitting said dispersed video signal and data concerning the operating sense of said dispersal filter to a receiver;
    at a receiver:
    means for receiving and detecting said dispersed video signal;
    means for receiving and detecting said data;
    a second dispersal filter;
    means for changing the operating sense of said second dispersal filter in response to said detected data; and
    means for processing said dispersed video signal with said second dispersal filter to recover said video signal.

* * * * *